United States Patent
Sikka et al.

(10) Patent No.: US 11,825,592 B2
(45) Date of Patent: *Nov. 21, 2023

(54) ELECTRONIC DEVICE CONSOLE WITH NATURAL DRAFT COOLING

(71) Applicant: INTERNATIONAL BUSINESS MACHINES CORPORATION, Armonk, NY (US)

(72) Inventors: Kamal K. Sikka, Poughkeepsie, NY (US); Chenzhou Lian, Poughquag, NY (US); Kathryn C. Rivera, Hopewell Junction, NY (US); Paul F. Bodenweber, Kingston, NY (US); Jon A. Casey, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 428 days.

This patent is subject to a terminal disclaimer.

(21) Appl. No.: 17/062,926

(22) Filed: Oct. 5, 2020

(65) Prior Publication Data

US 2021/0022239 A1  Jan. 21, 2021

Related U.S. Application Data

(60) Continuation of application No. 14/867,413, filed on Sep. 28, 2015, now Pat. No. 10,834,808, which is a
(Continued)

(51) Int. Cl.
*H05K 1/00* (2006.01)
*H05K 1/02* (2006.01)
*H05K 7/20* (2006.01)

(52) U.S. Cl.
CPC ....... *H05K 1/0203* (2013.01); *H05K 7/20127* (2013.01); *Y10T 29/49002* (2015.01)

(58) Field of Classification Search
None
See application file for complete search history.

(56) References Cited

U.S. PATENT DOCUMENTS

| 4,535,386 A | 8/1985 | Frey, Jr. et al. |
| 5,769,702 A | 6/1998 | Hanson |

(Continued)

FOREIGN PATENT DOCUMENTS

| JP | 10340137 | 12/1998 |
| JP | 2001291982 | 10/2001 |

(Continued)

OTHER PUBLICATIONS

Fisher, T. et al., "Analysis and Optimization of a Natural Draft Heat Sink System", IEEE Transactions on Components, Packaging, and Manufacturing Technology, vol. 20, No. 2, Jun. 1997, pp. 111-119.

*Primary Examiner* — James S. McClellan
*Assistant Examiner* — Jeffrey K Wong
(74) *Attorney, Agent, or Firm* — Kelsey M. Skodje; Andrew M. Calderon; Calderon Safran & Cole P.C.

(57) ABSTRACT

An electronic device console includes a console body that houses a chip package, and a duct extending from the console body. An interior volume of the duct is in fluid communication with an interior volume of the console body. A first vent is at a distal end of the duct. A second vent is in a wall of the console body. The console may be oriented in a first orientation and a second orientation. The duct functions as a chimney for natural convection cooling of the chip package when the console is oriented in the first orientation. The console body functions as a chimney for natural convection cooling of the chip package when the console is oriented in the second orientation.

19 Claims, 4 Drawing Sheets

Related U.S. Application Data division of application No. 13/551,693, filed on Jul. 18, 2012, now Pat. No. 9,226,426.

(56) References Cited

U.S. PATENT DOCUMENTS

| | | | |
|---|---|---|---|
| 5,871,396 A * | 2/1999 | Shen | G06F 1/20 361/695 |
| 5,912,803 A | 6/1999 | Dahl et al. | |
| 6,088,225 A | 7/2000 | Parry et al. | |
| D452,688 S | 1/2002 | Goto | |
| 6,354,937 B1 | 3/2002 | Crook | |
| 6,477,053 B1 | 11/2002 | Zeidan et al. | |
| 6,542,359 B2 | 4/2003 | Babcock et al. | |
| 7,099,153 B2 | 8/2006 | Yazawa | |
| 7,167,359 B2 | 1/2007 | Wendel et al. | |
| 7,209,348 B2 | 4/2007 | Yazawa | |
| 7,826,214 B2 | 11/2010 | Shuy | |
| 8,009,426 B2 | 8/2011 | Ahmad-Taylor et al. | |
| 8,325,479 B2 * | 12/2012 | Siracki | H05K 7/20918 361/679.48 |
| 2003/0218012 A1 * | 11/2003 | Kim | H05B 6/6423 219/757 |
| 2006/0056151 A1 * | 3/2006 | Hara | H05K 7/20145 165/104.33 |
| 2007/0290333 A1 * | 12/2007 | Saini | H01L 25/0657 257/723 |
| 2007/0295422 A1 | 12/2007 | Ostan et al. | |
| 2008/0218969 A1 | 9/2008 | Muraki | |
| 2009/0190307 A1 | 7/2009 | Krietzman | |
| 2010/0031527 A1 | 2/2010 | Robinson et al. | |
| 2010/0254085 A1 | 10/2010 | Hasegawa et al. | |
| 2011/0000574 A1 | 1/2011 | Nicewicz et al. | |
| 2011/0262175 A1 | 10/2011 | Takahashi | |
| 2011/0277865 A1 | 11/2011 | Kramer, Jr. et al. | |
| 2012/0111662 A1 | 5/2012 | Casado Abarquero | |
| 2012/0270492 A1 * | 10/2012 | VanDerVeen | H05K 7/20736 165/104.34 |
| 2013/0070409 A1 * | 3/2013 | Hoss | G06F 1/20 165/104.21 |
| 2014/0015106 A1 | 1/2014 | Hsieh et al. | |

FOREIGN PATENT DOCUMENTS

| | | |
|---|---|---|
| JP | 2007073579 | 3/2007 |
| JP | 2010118492 | 5/2010 |

* cited by examiner

ELECTRONIC DEVICE CONSOLE WITH NATURAL DRAFT COOLING

FIELD OF THE INVENTION

The invention relates to the cooling of electronic devices and, more particularly, to an electronic device console with natural draft cooling that can be oriented in both horizontal and vertical orientations.

BACKGROUND

Cooling an electronic chip package in an electronic device, e.g., a gaming console, projector, etc., may be accomplished using forced convection in which a fan blows air over the chip package and/or a heat sink connected to the chip package. A fan refers to any mechanism that uses motive force to move air, and can also be referred to as a forced air mechanism. While forced air convection systems generally provide sufficient cooling capacity for the chip package, fans have some undesirable qualities. For example, fans consume power, generate audible noise, cause vibration which may damage components in the electronic device, and can lead to overheating and failure of components in the electronic device in the event that the fan fails to operate.

Cooling an electronic chip package in an electronic device may be accomplished without using a fan by utilizing other heat transfer mechanisms, such as natural convection. Such approaches typically involve attaching a passive heat sink to the electronic chip package. However, natural convection cooling systems that do not utilize a fan typically have less cooling capacity than those that do use a fan, since convective heat transfer increases with increasing velocity of a moving fluid. This reduced cooling capacity can result in the chip in the electronic chip package operating at higher temperatures, which can affect the functional frequency and/or reliability of the chip Accordingly, there exists a need in the art to overcome the deficiencies and limitations described hereinabove.

SUMMARY

In a first aspect of the invention, there is an electronic device console that includes a console body that houses a chip package. The electronic device console also includes a duct extending from the console body, wherein an interior volume of the duct is in fluid communication with an interior volume of the console body. The electronic device console additionally includes a first vent at a distal end of the duct, and a second vent in a wall of the console body. The console is structured and arranged to be oriented in a first orientation and a second orientation. The duct functions as a chimney for natural convection cooling of the chip package when the console is oriented in the first orientation. The console body functions as a chimney for natural convection cooling of the chip package when the console is oriented in the second orientation.

In another aspect of the invention, there is an electronic device console including: a console body that houses a chip package; and a duct connected to the console body, wherein an interior volume of the duct is in fluid communication with an interior volume of the console body. The console also includes: a first vent at a distal end of the duct that places the interior volume of the duct in fluid communication with an ambient environment outside the console; and a second vent in a wall of the console body that places the interior volume of the console body in fluid communication with the ambient environment. The console is structured and arranged to be oriented in a first orientation and a second orientation. The chip package is cooled via natural convection cooling without using a fan that is inside or attached to the console. The duct provides a first chimney effect to the natural convection cooling of the chip package when the console is oriented in the first orientation. The console body provides a second chimney effect to the natural convection cooling of the chip package when the console is oriented in the second orientation.

In yet another aspect of the invention, there is a method of manufacturing an electronic device console. The method includes forming the console comprising a console body, a duct extending from the console body, a first vent at a distal end of the duct, and a second vent in the console body. The method also includes housing a chip package in the console body. The console is structured and arranged to be oriented in a first orientation and a second orientation. The chip package is cooled via natural convection cooling without using a fan that is inside or attached to the console. The duct provides a first chimney effect to the natural convection cooling of the chip package when the console is oriented in the first orientation. The console body provides a second chimney effect to the natural convection cooling of the chip package when the console is oriented in the second orientation.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to the cooling of electronic devices and, more particularly, to an electronic device console with natural draft cooling that can be oriented in both horizontal and vertical orientations. According to aspects of the invention, an electronic device console is structured and arranged to provide a chimney effect that enhances natural convection cooling of a chip package housed in the console. In embodiments, the console is structured and arranged such that a duct functions as a chimney in a first console orientation (e.g., horizontal), and the console body functions as a chimney in a second console orientation (e.g., vertical). A console in accordance with aspects of the invention thus utilizes the chimney effect for natural convection cooling of the chip package when the console is oriented in either the horizontal or vertical orientation. In this manner, implementations of the invention may be used to provide enhanced heat transfer (e.g., cooling) for a chip package contained in an electronic device console without using a fan or other forced air mechanism.

Natural convection can be an effective and reliable mechanism of heat removal for many electronic packaging applications. As is well understood by those of ordinary skill in the art, natural convection is a heat transfer mechanism that involves fluid motion caused by buoyancy forces that result from the density variations due to variations of temperature in the fluid.

In aspects of the invention, the chimney effect is used in an electronic device console to enhance the natural convection heat transfer, e.g., cooling of the chip package inside the console. In embodiments, the heat dissipated in the chip package drives a natural convection draft inside the console, and the presence of plural chimney-type structures in the console accelerates the natural convection draft leading to enhanced heat transfer away from the chip package. Air inlet and outlet vents may be provided at particular locations in the console body relative to the chip package, such that the console may be provided with a chimney-type structure when oriented in either a horizontal or vertical direction.

Figure 1:
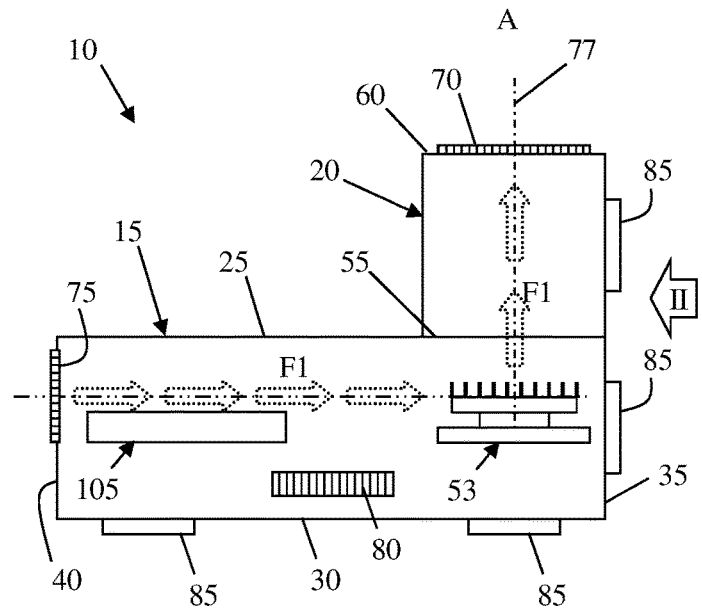
FIGS. 1-8 are views of an electronic device console in accordance with aspects of the invention.
Figure 2:
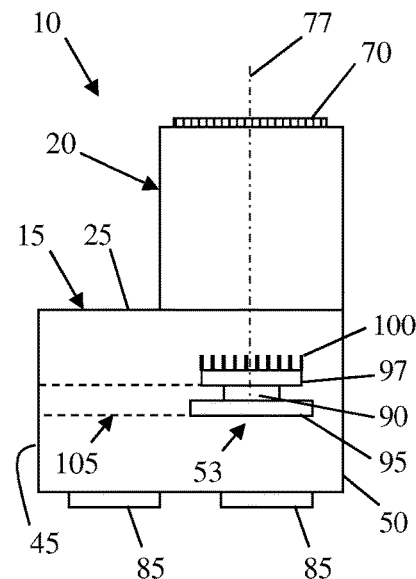
Figure 3:
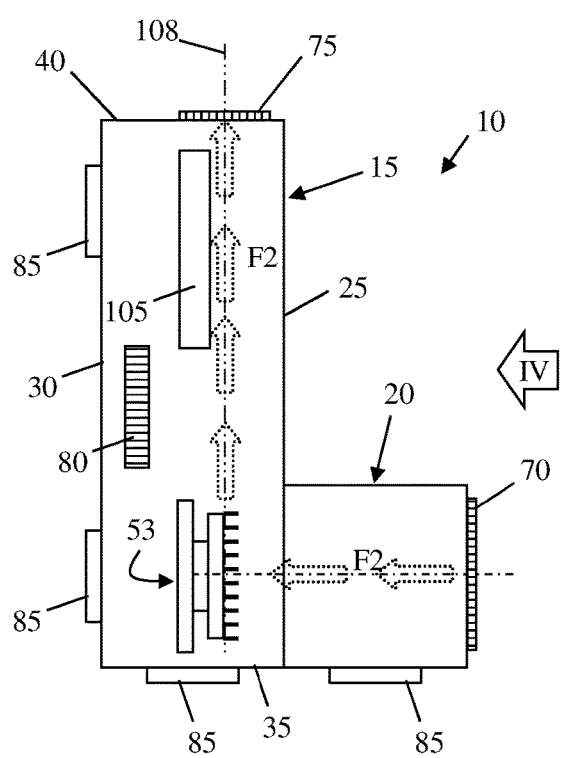
Figure 4:
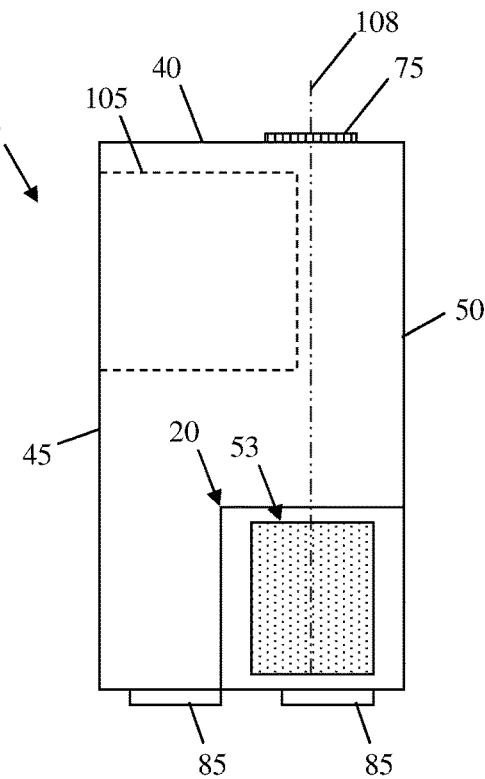

FIGS. 1-4 are views of an electronic device console 10 in accordance with aspects of the invention. FIGS. 1 and 2 show the console 10 in a first (e.g., horizontal) orientation, while FIGS. 3 and 4 show the console 10 in a second (e.g., vertical) orientation. In particular, FIG. 1 shows a front view of the console 10 comprising a console body 15 and a duct 20. FIG. 2 shows a side view of the console 10, viewed along arrow "II" in FIG. 1. The console body 15 may comprise a top 25, bottom 30, first lateral side 35, second lateral side 40, front 45, and back 50. The console body 15 defines an interior hollow interior volume in which one or more electronic components, such as chip package 53, are housed. In embodiments, the duct 20 comprises a hollow body with a proximate end 55 connected to the console body 15 (e.g., at an opening in the top 25) in a manner such that a hollow interior of the duct 20 is in fluid communication with the hollow interior of the console body 15. The duct 20 also includes a distal end 60 opposite the proximate end 55.

A first vent 70 is provided at the distal end 60 of the duct 20 and places the hollow interior of the duct 20 in fluid communication with the ambient environment "A". A second vent 75 is provided at one of the walls of the console body 15, e.g., at the second lateral side 40, and places the hollow interior of the console body 15 in fluid communication with the ambient environment.

Still referring to FIGS. 1 and 2, and in accordance with aspects of the invention, the first vent 70 acts as an air outlet, the second vent 75 acts as an air inlet, and the duct 20 acts as a chimney when the console 10 is arranged in the first (e.g., horizontal) orientation. In the first orientation, heat generated by the package 53 heats air inside the console body 15 that is in the immediate vicinity of the package 53, and this heated air rises inside the duct 20 toward the first vent 70. The movement of the heated air within the duct 20 draws air into the console body 15 through the second vent 75 via the chimney effect. The chimney effect provided by the duct 20 in the first orientation accelerates the natural convection draft of air across the package 53, which enhances/increases the natural convection heat transfer from the package 53. The natural convection air flow in this first orientation is indicated by arrows F1 in FIGS. 1 and 2. Optionally, the console may be structured and arranged such that the package 53 is substantially vertically aligned with the first vent 70 when the console is in the first orientation, as indicated by line 77.

The console 10 may be provided with one or more additional air vents 80 at any other desired location(s), including any one or more of the a top 25, bottom 30, first lateral side 35, second lateral side 40, front 45, and back 50. Any number of vents 80 may be used to provide additional air inlets and outlets to the interior volume of console body 15. The vents 80, as wells as vents 70 and 75, may have any suitable form, including but not limited to: slots, screen, mesh, louvered, adjustable opening size, etc.

Still referring to FIGS. 1 and 2, the console 10 may be provided with structural elements, such as feet 85, which are structured and arranged to support the console 10 on a surface, such as a table, shelf, etc., when the console is placed in one of the first and second orientations. One or more of the feet 85 may be located on the bottom 30, first lateral side 35, and the duct 85, although other locations are contemplated within the scope of the invention.

The package 53 may be any type of electronic chip package for which it is desired to provide cooling. For example, the package 53 may comprise a wirebond, flip-chip, or other type of chip package. More than one package 53 may be included in the console 10.

With specific reference to FIG. 2, the package 53 may include a chip 90 (such as a processor or memory integrated circuit chip) connected to a printed circuit board (PCB) 95. A heat sink 100 may be attached to the chip 90 to enhance heat transfer away from the chip 90. In an exemplary implementation, the package 53 is a flip-chip electronic package in which the chip 90 (e.g., a die) is joined to a ceramic or organic material substrate through controlled collapse chip connection (C4) bumps, which may be encapsulated in an underfill material. A lid 97 provides conductive heat transfer (e.g., cooling) and mechanical protection for the chip 90. A thermal interface material (TIM), which can be an elastomer, adhesive, gel or metal, may be disposed between the chip 90 and the lid 97. A bond, such as an elastomer, epoxy or mechanical fasteners, attaches the lid 97 to the substrate. The substrate may be further coupled to the PCB 95 via electrically conductive leads. A second TIM is disposed between the lid 97 and the heat sink 100. Each of the chip 90, PCB 95, lid 97, and heat exchanger 100 may be sized and shaped in any suitable configuration.

Still referring to FIGS. 1 and 2, the console 10 may comprise a system 105 that is structured and arranged to receive a disc, such as a compact disc (CD), digital video disc (DVD), or other media disc. The system 105 may comprise, for example, a slit-type opening into which a disc is inserted and ejected, or an extendable and retractable tray for receiving a disc, both of which are well known by those of ordinary skill in the art. The system 105 may operate to read data contained on the disc and provide this data to a chip in the package 53 for processing and/or storage. In one embodiment, the console 10 is a gaming console, the console 10 comprises the system 105 structured and arranged to receive a disc, and the package 53 comprises a gaming processor that executes a gaming application (e.g., a video game) based on data obtained from the disc. Additionally or alternatively, the console 10 may include one or more I/O connections such as microphones, headphones, speakers, USB ports, etc.

The console body 15 and duct 20 may be composed of any suitable materials, including but not limited to plastic, metal, and combinations thereof. The console body 15 may be the same material as the duct 20, or they may be made of different materials. The console body 15 and duct may be integrally formed or connected. Alternatively, the duct 20 may be selectively detachable from and re-attachable to the console body 15, e.g., for repair, replacement, and/or reducing the size of the console 10.

FIGS. 3 and 4 show the console 10 in the second orientation (e.g., a vertical orientation) that is different than the first orientation. In particular, FIG. 3 shows a front view of the console 10, and FIG. 4 shows a side view of the console 10 along arrow "IV" of FIG. 3. According to aspects of the invention, the first vent 70 acts as an air inlet, the second vent 75 acts as an air outlet, and the console body 15 acts as a chimney when the console 10 is arranged in the second (e.g., vertical) orientation. In the second orientation, heat generated by the package 53 heats air inside the console body 15 that is in the immediate vicinity of the package 53, and this heated air rises inside the console body 15 toward the second vent 75. The movement of the heated air within the console body 15 draws air into the duct 20 through the first vent 70 via the chimney effect. The chimney effect provided by the console body 15 in the second orientation accelerates the natural convection draft of air across the package 53, which enhances/increases the natural convection heat transfer from the package 53. The natural convection air flow in this first orientation is indicated by arrows F2 in FIGS. 3 and 4.

With reference to FIGS. 1-4, the package 53 may be spatially located within the console body 15 in a manner such that the package 53 is vertically aligned with the first vent 70 when the console 10 is in the first orientation, and also such that the package 53 is vertically aligned with the second vent 75 when the console 10 is in the second orientation. Alignment of the package with both vents 70 and 75 ensures optimal chimney action whether the console is in the first or second orientation. Such alignment may be defined, for example, as the first straight vertical line 77 intersecting both the package 53 and the first vent 70 when the console 10 is in the first orientation, and the second straight vertical line 108 intersecting both the package 53 and the second vent 75 when the console 10 is in the second orientation.

The invention is not limited to the configuration of the console 10 shown in FIGS. 1-4. For example, the console body 15 and or duct 20 may have shapes other than the rectangular shapes shown in the figures. Moreover, the duct 20 may be connected to console body 15 at any desired location at the top surface 25, or at any other desired surface of the console body 15. In short, the console body 15 and duct 20 may have any particular configuration that permits the console 10 to be oriented in first and second orientations, and that also provides a first chimney-type structure for chimney-effect-enhanced natural convection cooling of the package 53 when the console 10 is in the first orientation and a second chimney-type structure for chimney-effect-enhanced natural convection cooling of the package 53 when the console 10 is in the second orientation. In this manner, the package 53 may be effectively and reliably cooled by chimney-effect-enhanced natural convection cooling, without using a fan or other forced air mechanism, when the console 10 is placed in either one of the first and second orientations.

In accordance with some aspects of the invention, the console 10 is configured to cool the package 53 via natural convection, and not via forced convection, which means that a fan is not included in or attached to the console 10. In other words, the console 10 may be devoid of a fan. Avoiding the use of a fan provides benefits such as: reducing overall power consumption, reducing audible noise, reducing vibration, and providing reliable and fail-safe cooling. In accordance with other aspects of the invention, the console 10 is provided with a fan to supplement the convection cooling of the package 53. A fan may be desirable in high temperature environments where natural convection is insufficient to adequately cool the package 53. In either case, e.g., with or without a fan, it is contemplated that other heat transfer mechanisms, such as conduction and/or radiation, may be employed in the console 10 to assist in cooling the package 53.

Figure 5:
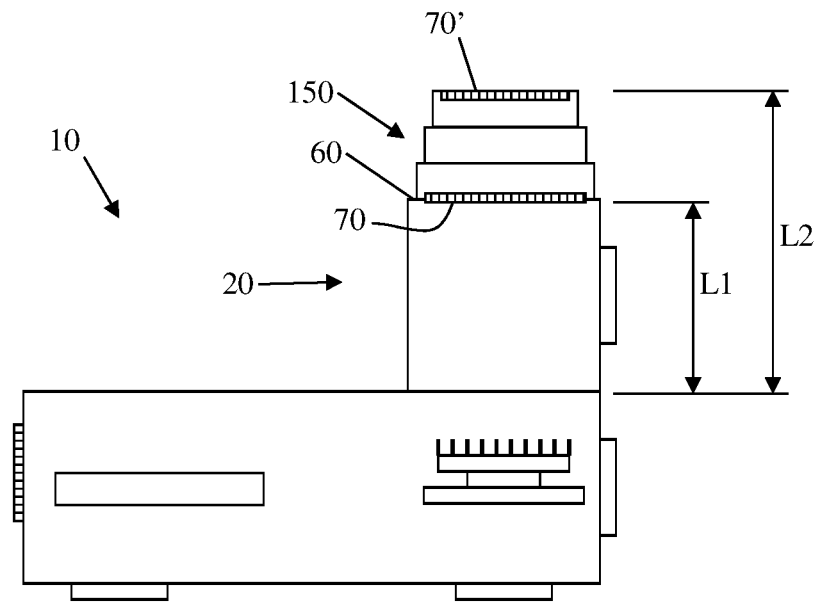
Figure 6:
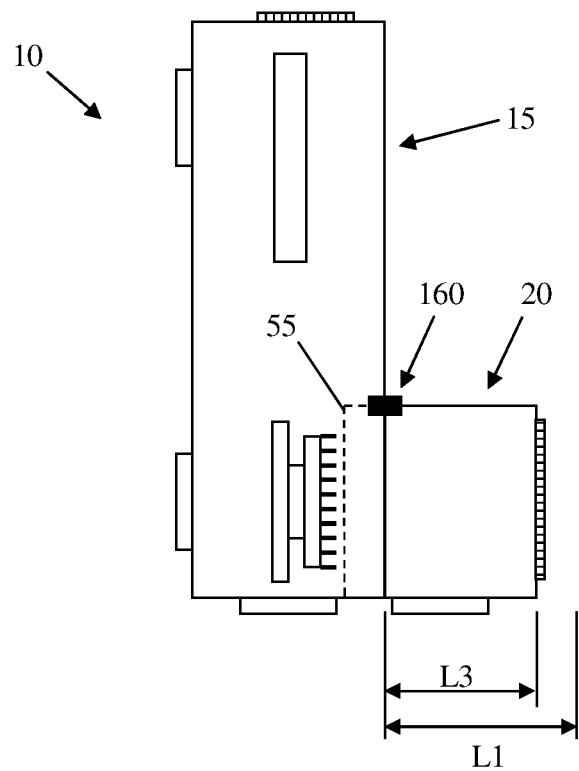

FIGS. 5-8 show additional aspects of the console 10. As shown in FIGS. 5 and 6, a length of the duct 20 may be adjustable. For example, the distal end 60 of the duct 20 may be provided with a telescoping structure 150 that permits adjustment of the length of the duct 20 to any desired value between, and including, L1 and L2. The vent 70 may remain at the distal end 60 of the duct 20, or may be connected to and moveable with a distal end of the telescoping structure 150, e.g., as indicated at reference number 70'. Increasing the length of the duct 20, e.g., to L2, when the console 10 is in the first orientation, as shown in FIG. 5, enhances the chimney effect provided by the duct 20, which enhances/increases the natural convection cooling of the package 53.

Additionally or alternatively, as shown in FIG. 6, the proximate end 55 of the duct 20 may be selectively movable into and out of the console body 15 to permit adjustment of the length of the duct 20 to any desired value between, and including, L1 and L3. For example, the console 10 may include a slide mechanism 160 that permits translational movement of the duct 20 relative to the console body 15. In this manner, the length of the duct 20 may be shortened for space savings when the console is oriented in the second orientation, e.g., as shown in FIG. 6.

Figure 7:
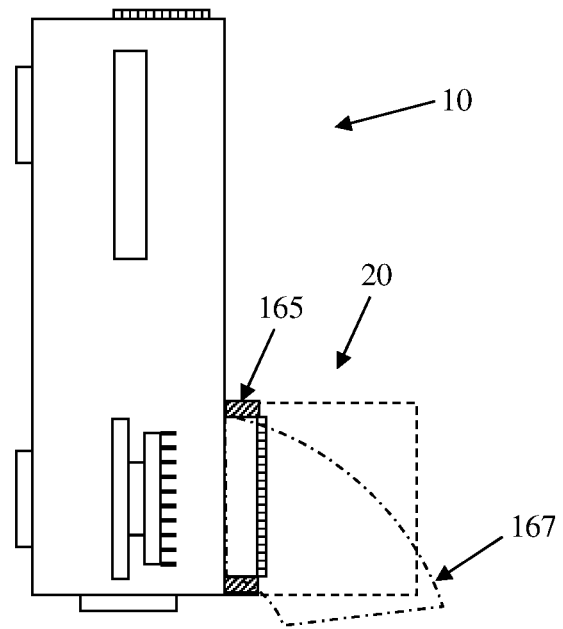

FIG. 7 shows another exemplary aspect of the console 10 in which the duct 20 is collapsible. For example, the duct 20 may be constructed as an accordion-like or telescoping structure 165 that permits the duct 20 to be collapsed to a fraction (e.g., one fifth or less) of its extended length (e.g., L1 from FIG. 5). In this manner, the duct 20 may be collapsed for space savings when the console is oriented in the second orientation, e.g., as shown in FIG. 7. Additionally or alternatively, the duct 20 may be sufficiently flexible such that it may be bent and maintained in a non-straight shape, e.g., as indicated by dashed outline 167. In this manner, the duct 20 may be re-positioned for being accommodated in a constrained space.

Figure 8:
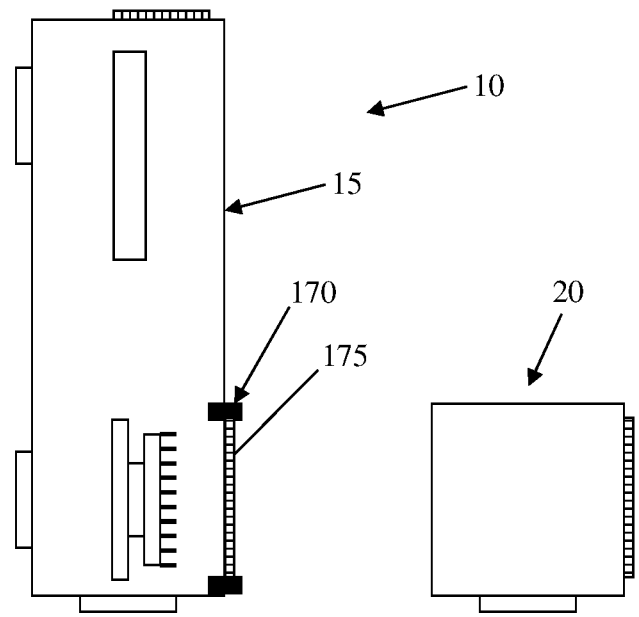

FIG. 8 shows another exemplary aspect of the console 10 in which the duct 20 is removable from the console body 15. For example, the console 10 may comprise a latch mechanism 170 that selectively connects the duct 20 to the console body 15. The console body 15 may include an opening 175 that serves as the air inlet in this configuration. In this manner, the duct 20 may be detached from the console body 15 for space savings when the console is oriented in the second orientation, e.g., as shown in FIG. 8.

Figure 9:
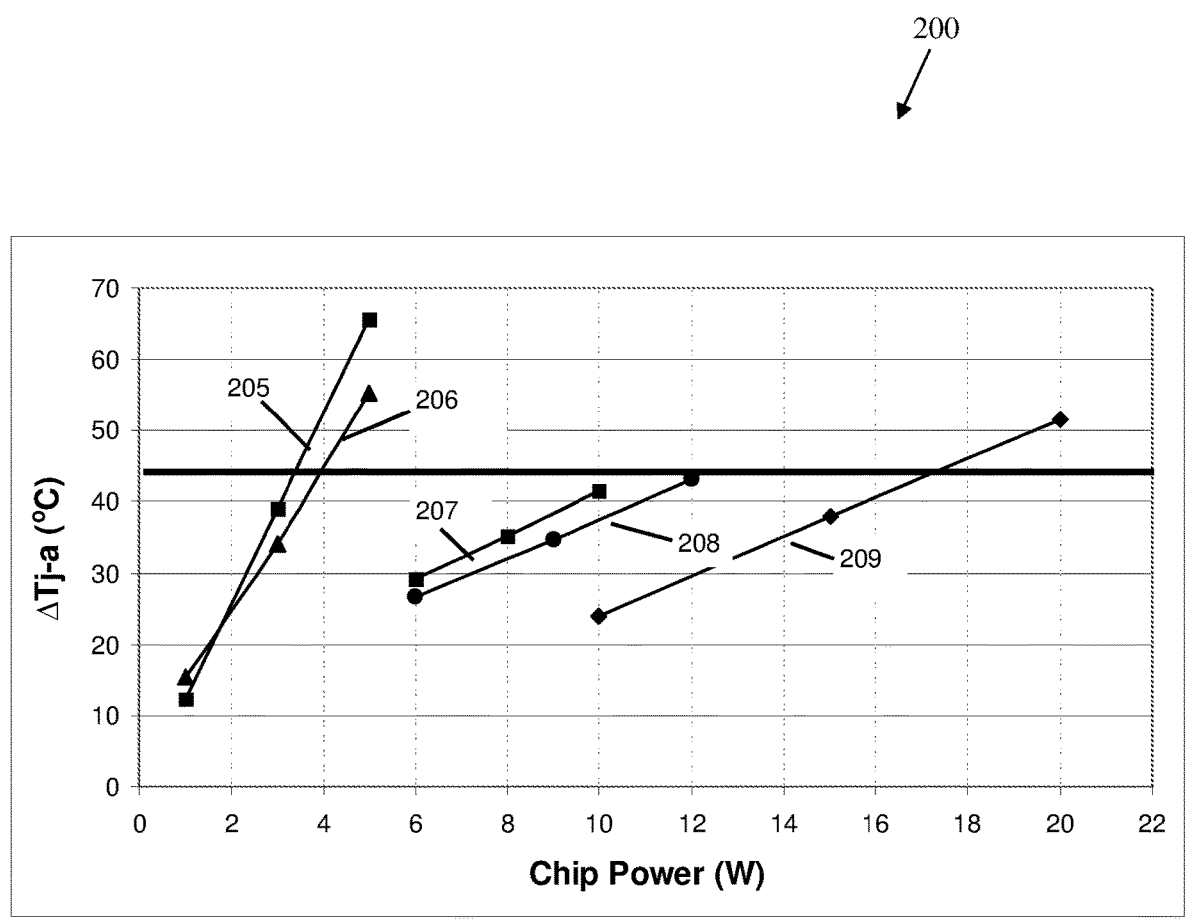
FIG. 9 is a graph showing power dissipation of various systems as a function of junction temperature in accordance with aspects of the invention.

FIG. 9 contains a graph 200 showing modeling data that relates power dissipation of various systems as a function of junction temperature in accordance with aspects of the invention. Curves 205-208 show the junction temperature of a 130 mm$^2$ area chip (y-axis) as a function of chip power (x-axis) for different cooling configurations within a console in which the delta between the target junction temperature and the ambient temperature inside the console (ΔTj-a) is about 45 degrees. Curve 205 corresponds to a chip package in which there is no lid, no heat sink, no chimney, and no fan. Curve 206 corresponds to a chip package in which there is a lid, but no heat sink, no chimney, and no fan. Curve 207 corresponds to a chip package in which there is a lid and a heat sink, but no chimney and no fan. Curve 208 corresponds to a chip package in which there is a lid, a heat sink, and a chimney, but no fan. The data for curve 208 corresponds to a chimney having an internal cross sectional area that is substantially the same as that of the heat sink, a chimney length of about 60 mm, and a wall thickness of about 3 mm. Curve 209 corresponds to a chip package in which there is a lid, a heat sink, and a chimney of length 160 mm and wall thickness of about 3 mm, but no fan.

Still referring to FIG. 9, the difference between curve 207 and curves 205 and 206 indicates that adding a heat sink to the chip package greatly enhances the natural convection cooling of the chip. The difference between curve 208 and curve 207 indicates that adding a chimney-effect to the natural convection cooling can increase the power dissipation by up to about 33%, which permits the chip to operate at higher functional frequency and/or reliability. Design parameters that appear to have the greatest impact on the natural convection cooling of the chip package in a console include: the size and configuration of the heat sink and the chimney height. The difference between curve 209 and curve 208 is due in part to the chimney height of 160 mm for curve 209 and 60 mm for curve 208. From this, it is estimated that a combined heat sink and chimney-enhanced natural convection cooling configuration can dissipate up to about 20 W from a 130 mm² chip area housed in a console with a ΔTj-a of about 45° C.

The corresponding structures, materials, acts, and equivalents of all means or step plus function elements in the claims, if applicable, are intended to include any structure, material, or act for performing the function in combination with other claimed elements as specifically claimed. Moreover, while the invention has been described in terms of embodiments, those of ordinary skill in the art will recognize that the invention can be practiced with modifications and in the spirit and scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. An electronic device console, comprising:
    a console body that comprises a hollow interior volume that houses a chip package;
    a duct extending from the console body;
    a first vent at a distal end of the duct; and
    a second vent in a wall of the console body,
    wherein the electronic device console is structured and arranged to be oriented in a first orientation and a second orientation,
    the electronic device comprises a slide mechanism positioned at a top orientation of the console body such that a proximate end of the duct is moveable into the console body through the slide mechanism that allows translational movement of the duct relative to the console body when the electronic device console is oriented in the first orientation, and the slide mechanism allows a portion of the duct to be moved within the console body,
    the duct comprises a hollow body which is in fluid communication with the hollow interior volume of the console body,
    the first vent is an outlet and the second vent is an inlet in the first orientation, and
    the first vent is an inlet and the second vent is an outlet in the second orientation.

2. The electronic device console of claim 1, wherein the electronic device console is devoid of a fan.

3. The electronic device console of claim 1, wherein a length of the duct is greater than a width of the duct.

4. The electronic device console of claim 1, wherein:
    the first vent is vertically aligned with the chip package in the first orientation; and
    the second vent is vertically aligned with the chip package in the second orientation.

5. The electronic device console of claim 1, wherein the chip package comprises: a chip, a printed circuit board, a lid, and a heat sink.

6. The electronic device console of claim 1, wherein:
    the electronic device console is a gaming console;
    the gaming console comprises a system structured and arranged to receive a disc; and
    the chip package comprises a gaming processor that executes a gaming application based on data obtained from the disc.

7. The electronic device console of claim 1, wherein a length of the duct is adjustable.

8. The electronic device console of claim 1, wherein a length of the duct outside of the console body is less than an extended length of the duct.

9. The electronic device console of claim 8, wherein the electronic device console comprises a fan to supplement convection cooling of the chip package.

10. The electronic device console of claim 1, wherein the chip package comprises a wirebond package.

11. The electronic device console of claim 10, wherein the duct is detachable from the console body.

12. The electronic device console of claim 1, wherein the duct functions as a chimney for natural convection cooling of the chip package when the electronic device console is oriented in the first orientation.

13. The electronic device console of claim 12, wherein the console body functions as a chimney for natural convection cooling of the chip package when the electronic device console is oriented in the second orientation.

14. The electronic device console of claim 1, wherein the chip package is spatially located within the console body such that a first straight vertical line intersects the chip package and the first vent when the electronic device console is oriented in the first orientation.

15. The electronic device console of claim 14, wherein the chip package is spatially located within the console body such that a second straight vertical line intersects the chip package and the second vent when the electronic device console is oriented in the second orientation.

16. The electronic device console of claim 15, further comprising a plurality of feet which is located on a bottom side and a lateral side of the electronic device console.

17. The electronic device console of claim 16, wherein the first vent and the second vent comprises a slot design.

18. An electronic device console, comprising:
    a console body that comprises a hollow interior volume that houses a chip package;
    a duct connected to the console body;
    a first vent at a distal end of the duct; and
    a second vent in a wall at a lateral side of the console body;
    wherein the electronic device console is structured and arranged to be oriented in a first orientation and a second orientation, the electronic device further comprises a slide mechanism positioned at a top of the console body and which allows translational movement of the duct relative to the console body when the electronic device console is oriented in the first orientation such that a proximate end of the duct is moveable into the console body through the slide mechanism, the first vent is vertically aligned with a chip package in the first orientation, and the second vent is vertically aligned with the chip package in the second orientation.

19. The electronic device console of claim 18, wherein:

in the first orientation, the first vent is an outlet and the second vent is an inlet of a first flow path of the natural convection cooling; and in the second orientation, the first vent is an inlet and the second vent is an outlet of a second flow path of the natural convection cooling.

\* \* \* \* \*